United States Patent
Tsai et al.

(10) Patent No.: US 10,269,544 B2
(45) Date of Patent: Apr. 23, 2019

(54) GAS RING FOR PLASMA SYSTEM AND METHOD OF MANUFACTURING THE SAME

(71) Applicant: TAIWAN SEMICONDUCTOR MANUFACTURING CO., LTD., Hsinchu (TW)

(72) Inventors: Wen-Pao Tsai, Hsinchu (TW); Tsung-Yu Huang, Zhubei (TW); Chung-Hsien Liao, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 716 days.

(21) Appl. No.: 14/700,858

(22) Filed: Apr. 30, 2015

(65) Prior Publication Data
US 2016/0148788 A1   May 26, 2016

Related U.S. Application Data

(60) Provisional application No. 62/083,741, filed on Nov. 24, 2014.

(51) Int. Cl.
| | | |
|---|---|---|
| C25D 7/00 | (2006.01) | |
| H01J 37/32 | (2006.01) | |
| C25D 7/04 | (2006.01) | |
| C25D 11/04 | (2006.01) | |

(52) U.S. Cl.
CPC .......... *H01J 37/32807* (2013.01); *C25D 7/04* (2013.01); *C25D 11/04* (2013.01); *H01J 37/32449* (2013.01); *H01J 37/32477* (2013.01); *H01J 37/32513* (2013.01)

(58) Field of Classification Search
CPC .......... H01J 37/32807; H01J 37/32513; H01J 37/32477; H01J 37/32449; C25D 11/04; C25D 7/04
USPC ................. 118/715; 156/345.33, 345.34
See application file for complete search history.

(56) References Cited

U.S. PATENT DOCUMENTS

| | | | | |
|---|---|---|---|---|
| 5,183,631 A * | 2/1993 | Kugimiya | ................. | B22F 1/02 419/10 |
| 2007/0259130 A1* | 11/2007 | Von Kaenel | ........ | C23C 16/4404 427/569 |
| 2009/0166328 A1* | 7/2009 | Kishimoto | .......... | H01J 37/3244 216/67 |
| 2013/0143037 A1* | 6/2013 | Suhonen | ................... | C23C 4/10 428/332 |
| 2014/0295670 A1* | 10/2014 | Shih | .................... | H01L 21/3065 438/710 |

\* cited by examiner

*Primary Examiner* — Rudy Zervigon
(74) *Attorney, Agent, or Firm* — Maschoff Brennan

(57) ABSTRACT

A gas ring for a plasma system includes a gas ring body having a surface and an insulating protective layer covering the surface. Methods of manufacturing the gas ring are also provided.

20 Claims, 5 Drawing Sheets

GAS RING FOR PLASMA SYSTEM AND METHOD OF MANUFACTURING THE SAME

BACKGROUND

In the fabrication of modern semiconductor devices, the deposition of a thin layer on a semiconductor substrate by chemical reaction of gases is one of the primary steps. Such deposition process is referred to generally as chemical-vapor deposition (CVD). Typical thermal CVD processes supply reactive gases to the substrate surface where heat-induced chemical reactions take place to produce a desired layer.

Plasma-enhanced CVD (PECVD) techniques, on the other hand, promote excitation and/or dissociation of the reactant gases by the application of radio frequency ("RF") energy to a reaction zone near the substrate surface, thereby creating plasma. The high reactivity of the species in the plasma reduces the energy required for a chemical reaction to take place, and thus lowers the temperature required for such CVD processes as compared to conventional thermal CVD processes. These advantages are further exploited by high density plasma (HDP) CVD techniques, in which dense plasma is formed at low vacuum pressures so that the plasma species are even more reactive.

High radio frequency power however induces arcing in the HDP-CVD system, which results in damage and thus formation of contamination or particles in the HDP-CVD system. The contamination or the particles may cause defect of substrates, or even scrap thereof. How to prevent the damage becomes an important issue in this field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
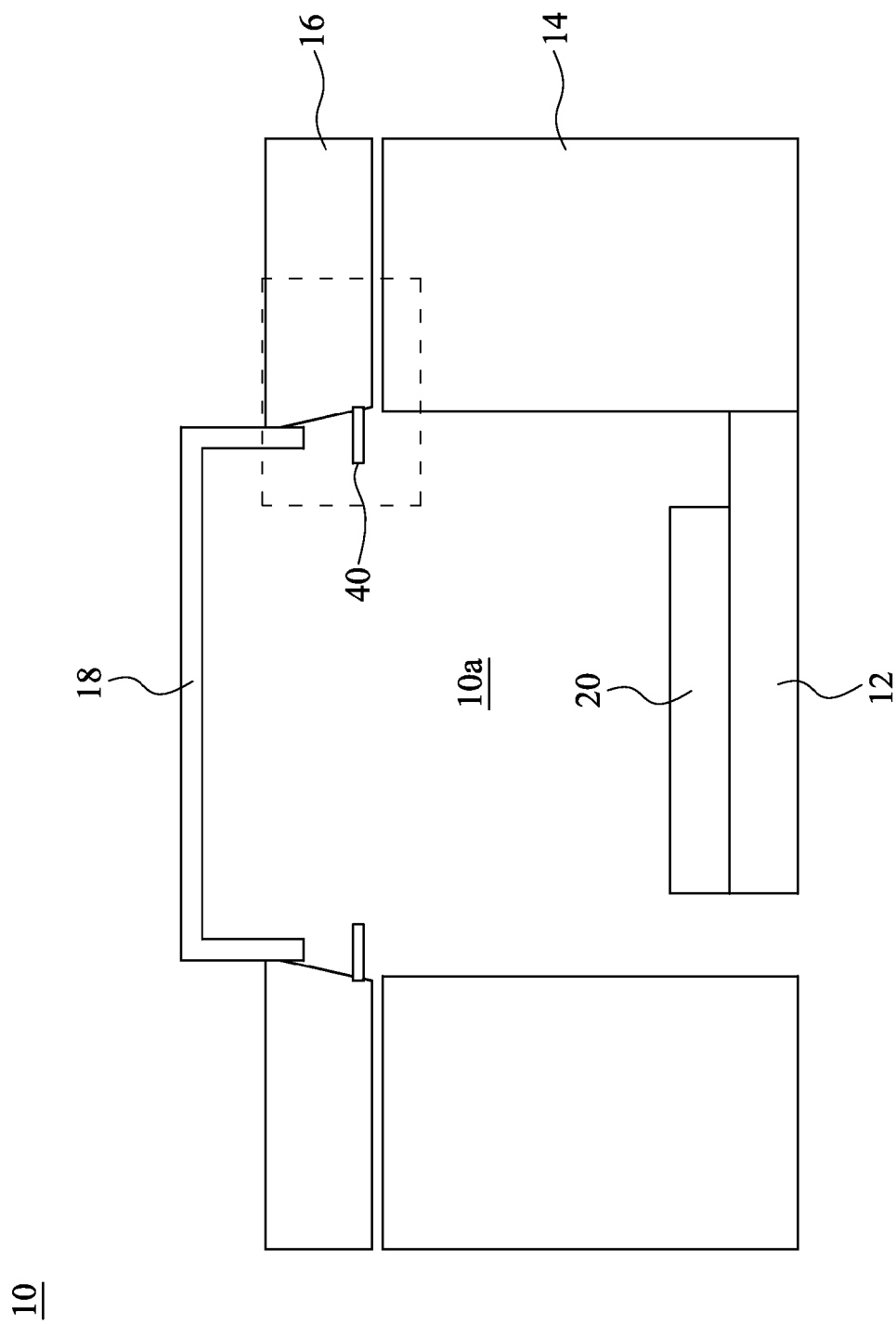
FIG. 1 is a simplified cross-sectional view of a chamber of a plasma system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As mentioned above, high radio frequency power induces arcing in the HDP-CVD system, which results in damage and thus formation of contamination or particles in the HDP-CVD system. The contamination or particles cause defect of substrates, or even scrap thereof. Specifically, arcing may damage a gas ring (typically a conductor) of a plasma system during plasma electron grounding through the gas ring, and thus to form conductive contamination or particles. The conductive contamination or particles may be fallen on the substrates, and arcing may occur at the conductive contamination or particles due to point discharge, resulting in defect of the substrates, or even scrap thereof.

In view of the foregoing, the present application provides a gas ring for a plasma system. The gas ring includes a gas ring body having a surface and an insulating protective layer covering the surface of the gas ring body. The insulating protective layer is configured to isolate the gas ring body from plasma, and thus to prevent the damage due to the arcing.

FIG. 1 is a simplified diagram of a chamber 10 of a plasma system in accordance with some embodiments of the present disclosure. In some embodiments, the plasma system is a high density plasma (HDP) system. The term "high density" is understood in this context to mean having an ion density that is equal to or exceeds $10^{11}$ ions/cm$^3$. In some embodiments, the high density plasma system is a high density plasma chemical vapor deposition (HDP-CVD) system. In some embodiments, the high density plasma chemical vapor deposition system is configured to form a shallow trench isolation (STI). In some embodiments, the high density plasma chemical vapor deposition system is configured to form a phosphosilicate glass (PSG).

As shown in FIG. 1, the chamber 10 includes a substrate support 12, a lower chamber 14, an upper chamber 16 and a dome 18. The upper chamber 16 is in contact with the dome 18. In some embodiments, the dome 18 is made of a ceramic dielectric material, such as aluminum oxide, aluminum nitride, any other suitable material or a combination thereof. The upper chamber 16 and the dome 18 define an upper boundary of a plasma processing region 10a. The substrate support 12 and the lower chamber 14 define a lower boundary of the plasma processing region 10a. The substrate support 12 is configured to support a substrate 20. In some embodiments, the substrate 20 has a diameter in a range of 200 mm to 450 mm. In some embodiments, the substrate 20 has a diameter of 200 mm, 300 nm or 450 mm. In some embodiments, there is an electrostatic chuck (ESC) (not shown) beneath the substrate 20 that secures the substrate 20 to the substrate support 12 during processing. In some embodiments, the substrate support 12 is made of aluminum oxide, aluminum nitride, any other aluminum ceramic material or a combination thereof.

Figure 2:
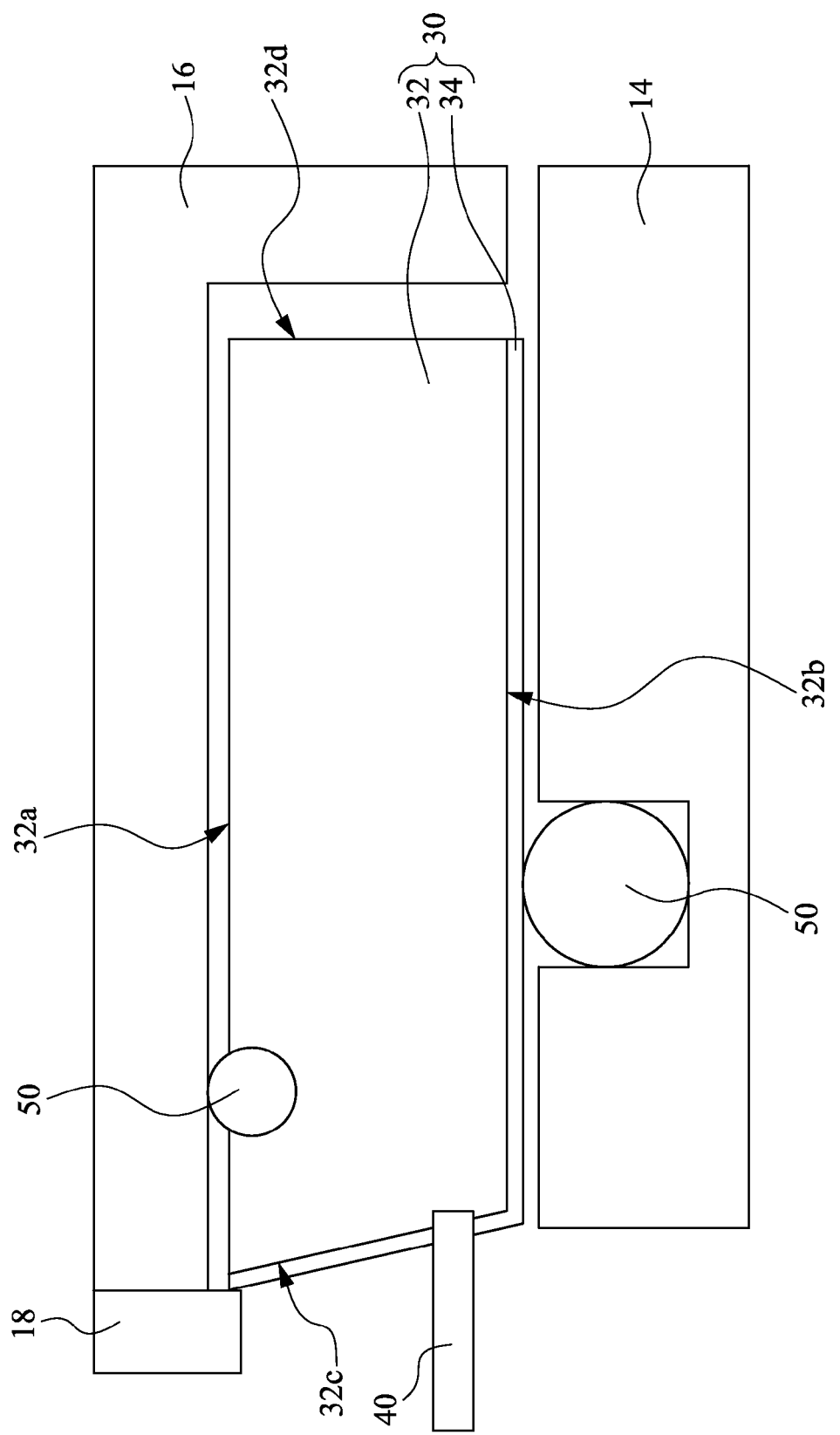
FIG. 2 is a simplified cross-sectional view of a gas ring in the chamber of FIG. 1 in accordance with some embodiments of the present disclosure.

FIG. 2 is a simplified cross-sectional view of a gas ring 30 in the chamber 10 of FIG. 1 in accordance with some embodiments of the present disclosure. As shown in the portion surrounded by a dotted line of FIG. 1 and FIG. 2, the gas ring 30 is floating mount between the lower chamber 14 and the upper chamber 16. The gas ring 30 includes a gas ring body 32 having a surface and an insulating protective layer 34 covering the surface of the gas ring body 32. In some embodiments, the gas ring body 32 includes any suitable metal or alloy. In some embodiments, the gas ring body 32 includes aluminum, magnesium, titanium, any other suitable metal or alloy, or a combination thereof.

In some embodiments, the surface includes an upper surface 32a, a lower surface 32b, an inner surface 32c, an outer surface 32d or a combination thereof. The term "upper surface" refers to the surface of the gas ring body facing a lower surface of the upper chamber. The term "lower surface" refers to the surface facing an upper surface of the lower chamber. In some embodiments, the upper surface 32a is opposite to and substantially parallel to the lower surface 32b. The inner surface 32c towards the plasma processing region 10a. The outer surface 32d is opposite to the inner surface 32c and facing away from the plasma processing region 10a. In the embodiments of FIG. 2, the insulating protective layer 34 covers the lower surface 32b and the inner surface 32c.

The insulating protective layer 34 is configured to isolate the gas ring body 32 from the plasma, and thus to prevent the damage due to the arcing. In some embodiments, the insulating protective layer 34 includes a crystalline metal oxide layer or an amorphous metal oxide layer. In some embodiments, the crystalline metal oxide layer includes crystalline aluminum oxide, crystalline magnesium oxide, crystalline titanium oxide, any other suitable crystalline metal oxide or a combination thereof. In some embodiments, the crystalline aluminum oxide includes α-aluminum oxide, γ-aluminum oxide or a combination thereof.

In some embodiments, the insulating protective layer 34 excludes crystal water, and thus is suitable for use in the plasma system. If there is crystal water existed in the insulating protective layer 34, it may affect the environment of the plasma processing region 10a. In addition, the insulating protective layer 34 excluding the crystal water can exhibit good UV resistance.

In some embodiments, the insulating protective layer 34 has a Vickers-hardness higher than or equal to 800, such that the insulating protective layer 34 can exhibit good anti-abrasion property. In some embodiments, the insulating protective layer 34 has a Vickers-hardness in a range of 800 to 1,500.

In some embodiments, the insulating protective layer 34 has a breakdown voltage greater than or equal to 900 V; that is, the insulating protective layer 34 possesses high voltage breakdown resistance. In some embodiments, the insulating protective layer has a breakdown voltage as high as 1,200 V.

In some embodiments, the insulating protective layer 34 has a thickness greater than or equal to 20 μm. In some embodiments, the thickness of the insulating protective layer 34 is in a range of 20 μm to 50 μm. In practical applications, the thickness of the insulating protective layer 34 may be adjusted to achieve enough breakdown voltage.

In some embodiments, the gas ring 30 further includes nozzles 40 (only one of which is shown for purposes of illustration) that provide a uniform flow of gas over the substrate 20 for processing, as shown in FIGS. 1 and 2. Nozzle length and nozzle angle may be changed to allow tailoring of the uniformity profile and gas utilization efficiency for a particular process within an individual chamber. In some embodiments, the nozzles 40 are made of aluminum oxide, aluminum nitride, any other suitable aluminum ceramic material or a combination thereof.

In some embodiments, the gas ring 30 further includes gas inlet (not shown) and one or more channels (not shown) therein. Each of the channels may be coupled or directly connected to the nozzles 40. The gases are introduced into the plasma processing region 10a through the gas inlet, the channels and the nozzles 40. In addition, there are seal rings 50 configured to engage a flexible seal surrounding the gas ring 30.

Figure 3:
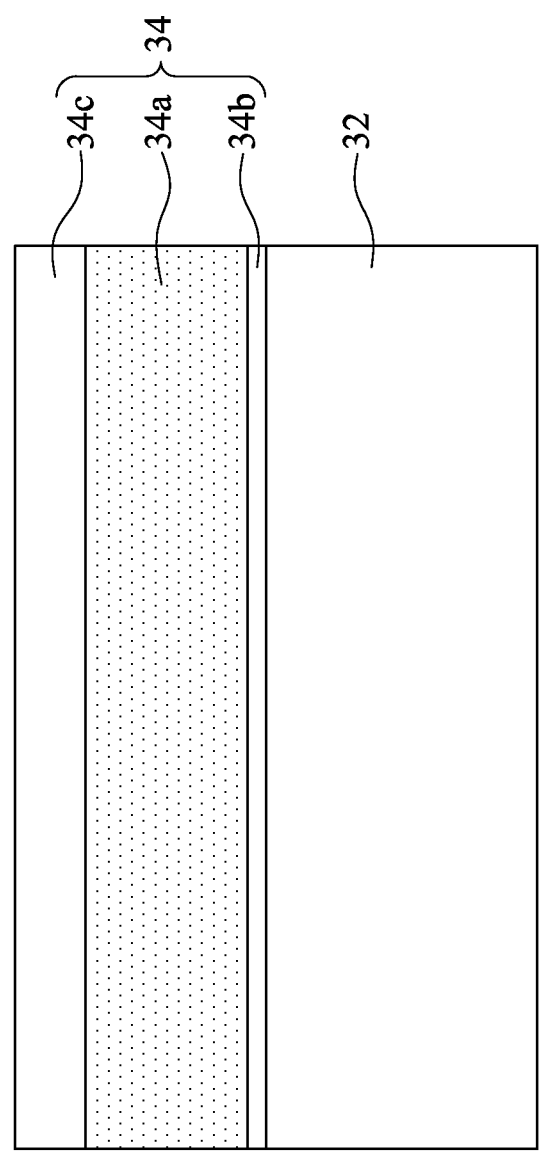
FIG. 3 is a close-up cross-sectional view of a portion of a gas ring in accordance with some embodiments of the present disclosure.

FIG. 3 is a close-up cross-sectional view of a portion of a gas ring in accordance with some embodiments of the present disclosure, which may be observed by scanning electron microscopy (SEM). In the embodiments, as shown in FIG. 3, the insulating protective layer 34 includes the crystalline metal oxide layer 34a, an interfacial layer 34b between the gas ring body 32 and the crystalline metal oxide layer 34a, and a porous layer 34c over the crystalline metal oxide layer 34a. However, in other embodiments, the insulating protective layer 34 may be composed of the crystalline metal oxide layer and the interfacial layer, or the crystalline metal oxide layer and the porous layer. In some embodiments, the interfacial layer 34b has a thickness less than or equal to 1 μm. In some embodiments, the interfacial layer 34b is tightly connected to the gas ring body 32 and the crystalline metal oxide layer 34a through atomic bonding, and thus the insulating protective layer 34 can exhibit good toughness, flexibility and bending property. Furthermore, the insulating protective layer 34 can exhibit good adhesion to the gas ring body 32 due to existence of the interfacial layer 34b, so as to avoid falling off of the insulating protective layer 34.

In some embodiments, the plasma system includes a radio frequency generator configured to provide a radio frequency power greater than or equal to 6,000 watts. In some embodiments, the radio frequency power is greater than or equal to 9,000 watts. In some embodiments, the high density plasma chemical vapor deposition system further includes a source plasma system (not shown) and a bias plasma system (not shown). In some embodiments, the source plasma system includes a top source radio frequency generator (not shown) and a side source radio frequency generator (not shown). In some embodiments, the top source radio frequency generator is configured to provide a radio frequency power greater than or equal to 6,000 watts. In some embodiments, the side source radio frequency generator is configured to provide a radio frequency power greater than or equal to 6,000 watts. In some embodiments, the top source radio frequency generator and the side source radio frequency generator are respectively coupled to a top of the dome 18 and a side thereof. In some embodiments, the bias plasma system includes a bias radio frequency generator (not shown). In some embodiments, the bias radio frequency generator is configured to provide a radio frequency power greater than or equal to 6,000 watts.

In some embodiments, the high density plasma chemical vapor deposition system further includes a vacuum system (not shown) configured to control chamber pressure. In some embodiments, the vacuum system includes throttle valve, gate valve and a turbo-molecular pump.

In some embodiments, the high density plasma chemical vapor deposition system further includes a remote plasma cleaning system (not shown) configured to clean deposition residues from chamber components. In some embodiments, the remote plasma cleaning system includes a remote microwave generator that creates plasma from a cleaning gas source (e.g., molecular fluorine, nitrogen, nitrogen fluoride, other fluorocarbons, any other suitable material or a combination thereof) in reactor cavity (not shown). The reactive species resulting from this plasma are conveyed to the chamber 10 through a cleaning gas feed port (not shown) via an applicator tube (not shown).

Figure 4:
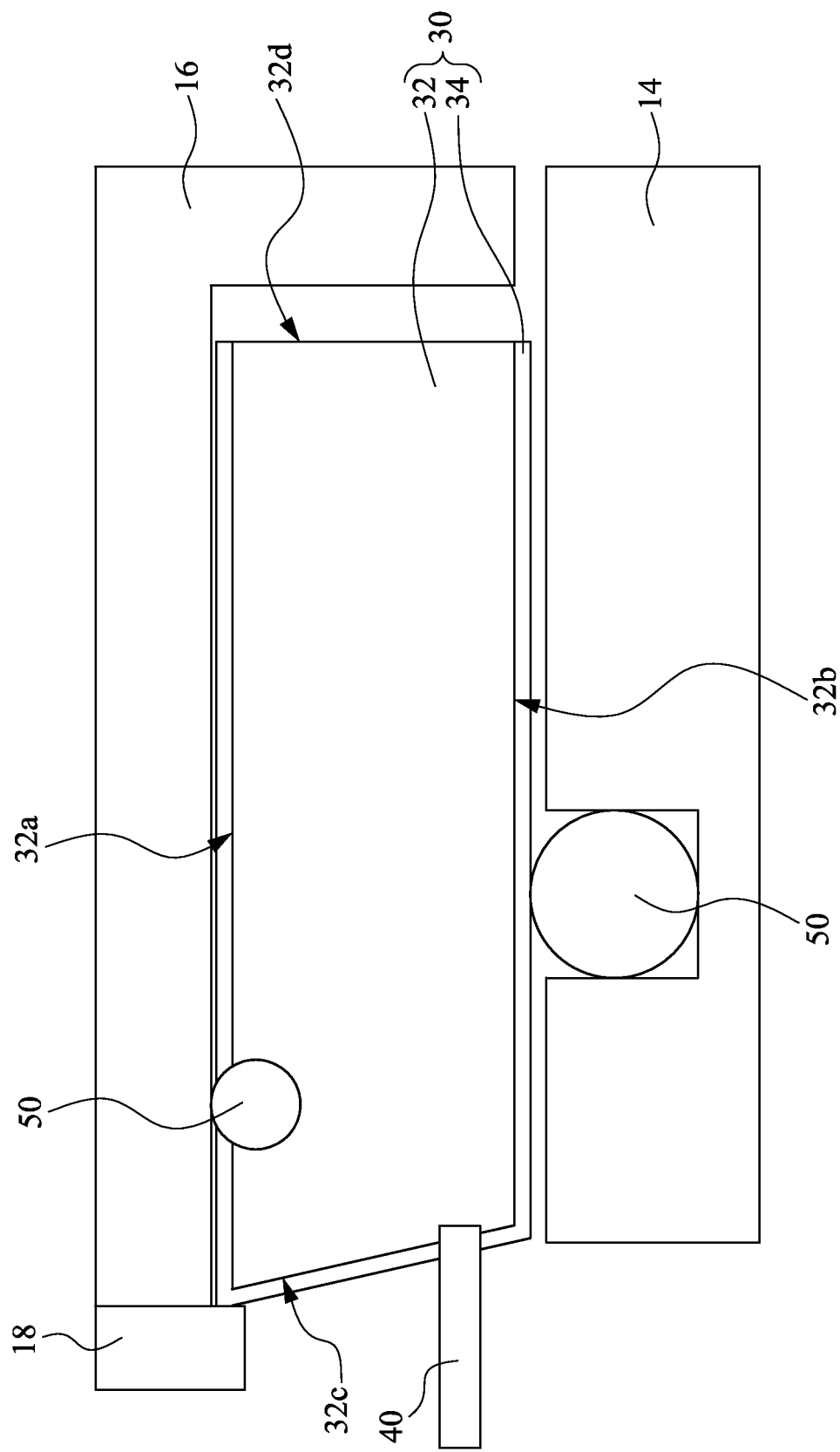
FIG. 4 is a simplified cross-sectional view of a gas ring in accordance with some embodiments of the present disclosure.

FIG. 4 is a simplified cross-sectional view of a gas ring in accordance with some embodiments of the present disclosure. Compared to the embodiments shown in FIG. 2, the insulating protective layer 34 of the embodiments shown in FIG. 4 further covers the upper surface 32a.

Figure 5:
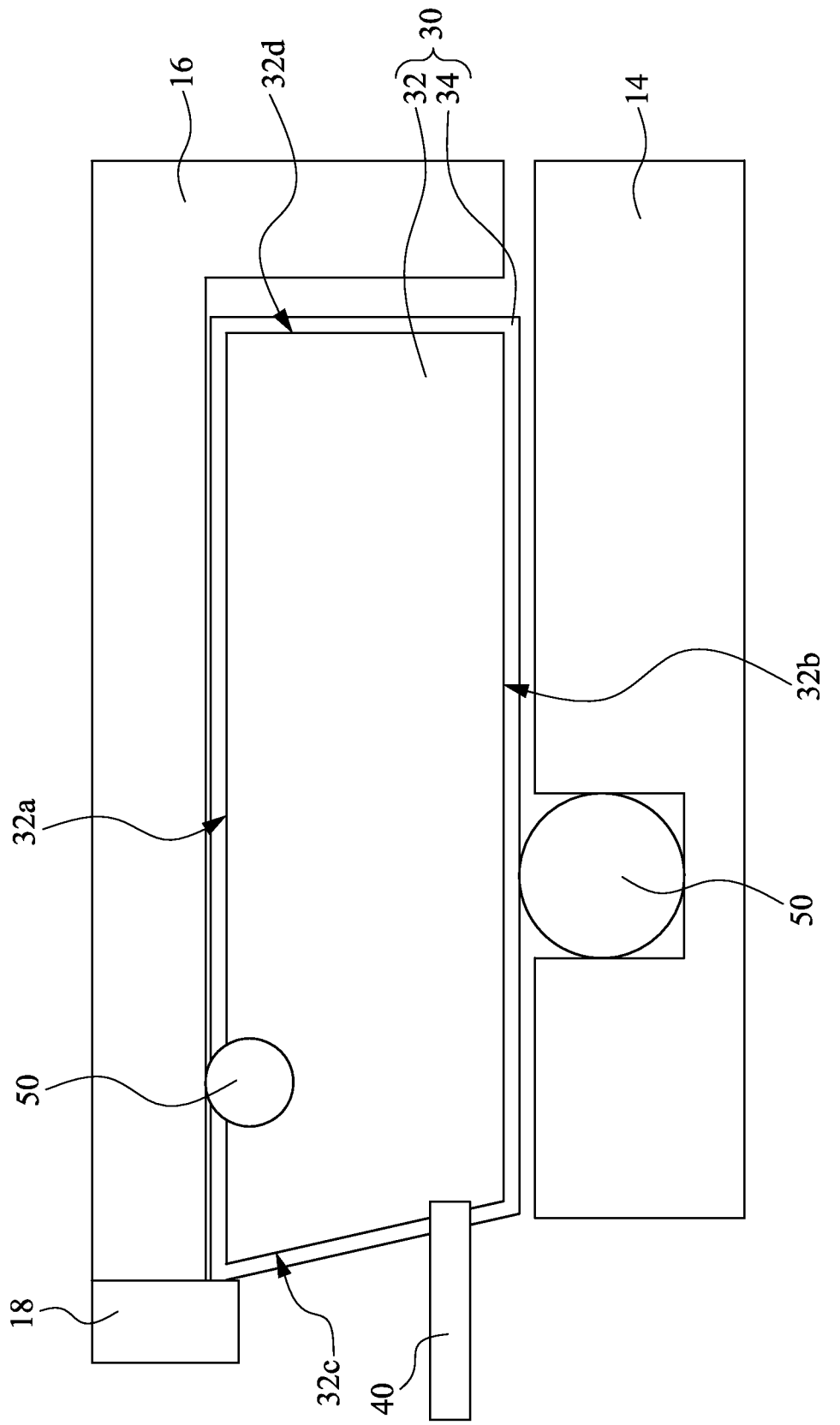
FIG. 5 is a simplified cross-sectional view of a gas ring in accordance with some embodiments of the present disclosure.

FIG. 5 is a simplified cross-sectional view of a gas ring in accordance with some embodiments of the present disclosure. Compared to the embodiments shown in FIG. 4, the insulating protective layer 34 of the embodiments shown in FIG. 5 further covers the outer surface 32d to fully protect the gas ring body 32.

The present disclosure also provides a method of manufacturing a gas ring for a plasma system. In some embodiments, the plasma system is a high density plasma system. In some embodiments, the high density plasma system is a high density plasma chemical vapor deposition system. The method includes receiving an aluminum-containing gas ring body, such as the gas ring body 32 of FIG. 2, 4 or 5. In some embodiments, the aluminum-containing gas ring body is made of aluminum.

An aluminum oxide-containing layer, such as the layer 34 of FIG. 2, 4 or 5, is then formed covering a surface of the aluminum-containing gas ring body. In some embodiments, the aluminum oxide-containing layer is formed using anodic oxidation treatment, micro arc plasma oxidation (MAPO), atmospheric plasma oxidation, thermal plasma oxidation, thermal oxidation, any other suitable oxidation or a combination thereof. In some embodiments, the aluminum oxide-containing layer includes crystalline aluminum oxide, amorphous aluminum oxide or a combination thereof. In some embodiments, the surface of the aluminum-containing gas ring body includes an upper surface, a lower surface, an inner surface, an outer surface or a combination thereof. In some embodiments, the aluminum oxide-containing layer covers the lower surface of the aluminum-containing gas ring body and the inner surface thereof.

In some embodiments, the aluminum oxide-containing layer is formed by performing the anodic oxidation treatment on the aluminum-containing gas ring body. The aluminum oxide-containing layer is formed through chemical oxidation and electrochemical oxidation during the anodic oxidation treatment. In some embodiments, the aluminum-containing gas ring body is acted as an anode, and a stainless steel is acted as a cathode.

In some embodiments, the aluminum-containing gas ring body is dipped in an acidic electrolyte solution, and the aluminum-containing gas ring body is then electrified in the acidic electrolyte solution to form the aluminum oxide-containing layer covering the surface of the aluminum-containing gas ring body. In some embodiments, the acidic electrolyte solution includes sulfuric acid, chromic acid, oxalic acid or a combination thereof, which has a concentration in a range of 3 g/l to 25 g/l.

In some embodiments, the aluminum-containing gas ring body is dipped in an electrolyte solution, and the aluminum-containing gas ring body is then electrified in the electrolyte solution to form the aluminum oxide-containing layer covering the surface of the aluminum-containing gas ring body, in which the electrolyte solution is at a temperature less than 5° C.

In some embodiments, the aluminum oxide-containing layer formed using the anodic oxidation treatment includes crystal water. In some embodiments, the aluminum oxide-containing layer formed using the anodic oxidation treatment includes the amorphous aluminum oxide.

In some embodiments, the aluminum oxide-containing layer is formed by performing the micro arc plasma oxidation on the aluminum-containing gas ring body. The micro arc plasma oxidation is also called as plasma electrolytic oxidation or anodic spark deposition. In some embodiments, the aluminum-containing gas ring body is acted as an anode, and a stainless steel is acted as a cathode. In some embodiments, the micro arc plasma oxidation is performed with a current greater than that of the anodic oxidation treatment. In some embodiments, the micro arc plasma oxidation is applied with a voltage greater than that of the anodic oxidation treatment. In some embodiments, the micro arc plasma oxidation is performed at a temperature greater than that of the anodic oxidation treatment. The aluminum oxide-containing layer is formed through chemical oxidation, electrochemical oxidation and high temperature plasma oxidation during the micro arc plasma oxidation. Specifically, an aluminum oxide thin film is firstly formed, and then broken by high voltage to form a plasma region with high temperature and high pressure. The aluminum adjacent to the plasma region will be melted, and the electrolyte solution adjacent thereto will be vaporized due to the plasma region. The melted aluminum will be reacted with oxygen free radical to form the aluminum oxide-containing layer including the crystalline aluminum oxide. In some embodiments, the crystalline aluminum oxide includes α-aluminum oxide, γ-aluminum oxide or a combination thereof.

In some embodiments, the aluminum-containing gas ring body is dipped in a basic electrolyte solution, and the aluminum-containing gas ring body is then electrified in the basic electrolyte solution to form the aluminum oxide-containing layer covering the surface of the aluminum-containing gas ring body. In some embodiments, the basic electrolyte solution includes sodium silicate, sodium aluminate, sodium phosphate or a combination thereof, which has a concentration in a range of 3 g/l to 25 g/l. In some embodiments, the basic electrolyte solution further includes sodium hydroxide, potassium hydroxide or a combination thereof, which has a concentration in a range of 3 g/l to 25 g/l.

In some embodiments, the aluminum-containing gas ring body is dipped in an electrolyte solution, and the aluminum-containing gas ring body is then electrified in the electrolyte solution to form the aluminum oxide-containing layer covering the surface of the aluminum-containing gas ring body, in which the electrolyte solution is at a temperature in a range of 5° C. to 50° C. In some embodiments, the electrolyte solution is at a temperature in a range of 20° C. to 50° C.

In some embodiments, the aluminum oxide-containing layer formed using the micro arc plasma oxidation excludes crystal water, and thus is suitable for use in the plasma system and can exhibit good UV resistance.

In some embodiments, the aluminum oxide-containing layer formed using the micro arc plasma oxidation has a Vickers-hardness higher than or equal to 800, such that the aluminum oxide-containing layer can exhibit good anti-abrasion property.

In some embodiments, the aluminum oxide-containing layer formed using the micro arc plasma oxidation has a breakdown voltage greater than or equal to 900 V; that is, the aluminum oxide-containing layer possesses high voltage breakdown resistance. In some embodiments, the aluminum oxide-containing layer formed using the micro arc plasma oxidation exhibits good heat resistance (e.g., as high as 750° C.), corrosion resistance and thermal shock resistance.

The present disclosure further provides a method of manufacturing a gas ring for a plasma system. In some embodiments, the plasma system is a high density plasma system. In some embodiments, the high density plasma system is a high density plasma chemical vapor deposition system. The method includes receiving a metal gas ring body, such as the gas ring body 32 of FIG. 2, 4 or 5. In some embodiments, the metal gas ring body includes aluminum, magnesium, titanium or a combination thereof.

A crystalline metal oxide-containing layer, such as the layer 34 of FIG. 2, 4 or 5, is then formed covering a surface of the metal gas ring body. In some embodiments, the crystalline metal oxide-containing layer is formed using micro arc plasma oxidation, atmospheric plasma oxidation, thermal plasma oxidation, thermal oxidation, any other suitable oxidation or a combination thereof. In some embodiments, the surface of the metal gas ring body includes an upper surface, a lower surface, an inner surface, an outer surface or a combination thereof. In some embodiments, the crystalline metal oxide-containing layer covers the lower surface of the metal gas ring body and the inner surface thereof.

In some embodiments, the crystalline metal oxide-containing layer is formed by performing the micro arc plasma oxidation on the metal gas ring body. In some embodiments, the metal gas ring body is acted as an anode, and a stainless steel is acted as a cathode. The crystalline metal oxide-containing layer is formed through chemical oxidation, electrochemical oxidation and high temperature plasma oxidation during the micro arc plasma oxidation. Specifically, a metal oxide thin film is firstly formed, and then broken by high voltage to form a plasma region with high temperature and high pressure. The metal adjacent to the plasma region will be melted, and the electrolyte solution adjacent thereto will be vaporized due to the plasma region. The melted metal will be reacted with oxygen free radical to form the crystalline metal oxide-containing layer. In some embodiments, the crystalline metal oxide-containing layer includes crystalline aluminum oxide, crystalline magnesium oxide, crystalline titanium oxide or a combination thereof. In some embodiments, the crystalline aluminum oxide includes α-aluminum oxide, γ-aluminum oxide or a combination thereof.

In some embodiments, the metal gas ring body is dipped in a basic electrolyte solution, and the metal gas ring body is then electrified in the basic electrolyte solution to form the crystalline metal oxide-containing layer covering the surface of the metal gas ring body. In some embodiments, the basic electrolyte solution includes sodium silicate, sodium aluminate, sodium phosphate or a combination thereof, which has a concentration in a range of 3 g/l to 25 g/l. In some embodiments, the basic electrolyte solution further includes sodium hydroxide, potassium hydroxide or a combination thereof, which has a concentration in a range of 3 g/l to 25 g/l.

In some embodiments, the metal gas ring body is dipped in an electrolyte solution, and the metal gas ring body is then electrified in the electrolyte solution to form the crystalline metal oxide-containing layer covering the surface of the metal gas ring body, in which the electrolyte solution is at a temperature in a range of 5° C. to 50° C. In some embodiments, the electrolyte solution is at a temperature in a range of 20° C. to 50° C.

In some embodiments, the metal oxide-containing layer formed using the micro arc plasma oxidation excludes crystal water, and thus is suitable for use in the plasma system and can exhibit good UV resistance.

In some embodiments, the metal oxide-containing layer formed using the micro arc plasma oxidation has a Vickers-hardness higher than or equal to 800, such that the metal oxide-containing layer can exhibit good anti-abrasion property.

In some embodiments, the metal oxide-containing layer formed using the micro arc plasma oxidation has a breakdown voltage greater than or equal to 900 V; that is, the metal oxide-containing layer possesses high voltage breakdown resistance. In some embodiments, the metal oxide-containing layer formed using the micro arc plasma oxidation exhibits good heat resistance (e.g., as high as 750° C.), corrosion resistance and thermal shock resistance.

According to some embodiments, a gas ring for a plasma system includes a gas ring body having a surface and an insulating protective layer covering the surface.

According to some embodiments, a method of manufacturing a gas ring for a plasma system includes receiving an aluminum-containing gas ring body and forming an aluminum oxide-containing layer covering a surface of the aluminum-containing gas ring body.

According to some embodiments, a method of manufacturing a gas ring for a plasma system includes receiving a metal gas ring body and forming a crystalline metal oxide-containing layer covering a surface of the metal gas ring body.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A plasma system, comprising:
   a gas ring including:
      a gas ring body having an upper surface, a lower surface, an inner surface, and an outer surface; and
      an insulating protective layer covering the inner surface of the gas ring but not the upper and outer surfaces of the gas ring body, wherein the insulating protective layer comprises a crystalline metal oxide layer.

2. The plasma system of claim 1, wherein the crystalline metal oxide layer comprises crystalline magnesium oxide, crystalline titanium oxide or a combination thereof.

3. The plasma system of claim 1, wherein the crystalline metal oxide layer comprises y-aluminum oxide.

4. The plasma system of claim 1, wherein the insulating protective layer further comprises an interfacial layer between the gas ring body and the crystalline metal oxide layer, a porous layer over the crystalline metal oxide layer, or a combination thereof.

5. The plasma system of claim 1, wherein the gas ring body comprises magnesium, titanium or a combination thereof.

6. The plasma system of claim 1, wherein the insulating protective layer has a Vickers-hardness higher than or equal to 800.

7. The plasma system of claim 1, wherein the insulating protective layer has a breakdown voltage greater than or equal to 900 V.

8. The plasma system of claim 1, wherein the insulating protective layer has a thickness greater than or equal to 20 µm.

9. The plasma system of claim 1, further comprising a radio frequency generator configured to provide a radio frequency power greater than or equal to 6,000 watts.

10. A plasma system, comprising:
a gas ring including:
a gas ring body having an upper surface, a lower surface, an inner surface, and an outer surface; and
an insulating protective layer covering the inner surface of the gas ring body but not the outer surface of the gas ring body, wherein the insulating protective layer comprises
a crystalline metal oxide layer.

11. The plasma system of claim 10, further comprising a porous layer over the crystalline metal oxide layer.

12. A plasma system comprising:
a gas ring having an upper surface, a lower surface, an inner surface, and an outer surface; and
a protective layer covering the inner surface of the gas ring but not the upper surface of the gas ring and including a crystalline metal oxide layer.

13. The plasma system of claim 12, wherein the protective layer comprises crystalline aluminum oxide.

14. The plasma system of claim 12, wherein the protective layer further includes an interfacial layer between the gas ring and the crystalline metal oxide layer.

15. The plasma system of claim 12, wherein the protective layer further includes a porous layer over the crystalline metal oxide layer.

16. The plasma system of claim 12, wherein the gas ring includes aluminum.

17. The plasma system of claim 10, wherein the gas ring body includes aluminum.

18. The plasma system of claim 1, further comprising:
an upper chamber; and
a seal ring in contact with the upper chamber and the upper surface of the gas ring body.

19. The plasma system of claim 1, further comprising:
a lower chamber; and
a seal ring in contact with the lower chamber and the insulating protective layer covering the lower surface of the gas ring body.

20. The plasma system of claim 1, wherein the crystalline metal oxide layer comprises α-aluminum oxide.

* * * * *